(12) United States Patent
Ryu et al.

(10) Patent No.: US 9,706,652 B2
(45) Date of Patent: Jul. 11, 2017

(54) PRINTED CIRCUIT BOARD AND METHOD FOR MANUFACTURING SAME

(75) Inventors: Sung Wuk Ryu, Seoul (KR); Seong Bo Shim, Seoul (KR); Seung Yul Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 182 days.

(21) Appl. No.: 13/997,596

(22) PCT Filed: Dec. 23, 2011

(86) PCT No.: PCT/KR2011/010057
§ 371 (c)(1),
(2), (4) Date: Sep. 19, 2013

(87) PCT Pub. No.: WO2012/087072
PCT Pub. Date: Jun. 28, 2012

(65) Prior Publication Data
US 2014/0000947 A1    Jan. 2, 2014

(30) Foreign Application Priority Data

Dec. 24, 2010 (KR) .................. 10-2010-0134546
Dec. 24, 2010 (KR) .................. 10-2010-0134547

(51) Int. Cl.
*H05K 1/09* (2006.01)
*H01L 23/48* (2006.01)
(Continued)

(52) U.S. Cl.
CPC ............. *H05K 1/09* (2013.01); *H05K 3/4007* (2013.01); *H05K 13/00* (2013.01); *H05K 3/28* (2013.01);
(Continued)

(58) Field of Classification Search
CPC .......... H05K 2203/0361; H05K 3/243; H05K 2201/0367; H05K 2201/0379; H05K 2201/0347; H05K 1/09
(Continued)

(56) References Cited

U.S. PATENT DOCUMENTS 6,420,255 B1   7/2002   Takahashi
6,461,953 B1   10/2002  Sakuyama et al.
(Continued)

FOREIGN PATENT DOCUMENTS

CN    101420821 A    4/2009
JP    2000-208911 A  7/2000
(Continued)

OTHER PUBLICATIONS

English Machine Translation of Miura (JP2004-79839A).*
(Continued)

*Primary Examiner* — Chau N Nguyen
*Assistant Examiner* — Roshn Varghese
(74) *Attorney, Agent, or Firm* — Saliwanchik, Lloyd & Eisenschenk (57) ABSTRACT

A printed circuit board according the present embodiment includes an insulating layer; at least one circuit pattern or pad formed on the insulating layer; a solder resist having an opening section exposing the upper surface of the pad and formed on the insulating layer and a bump formed on the pad exposed through the opening section of the solder resist and having a lower area narrower than the upper area.

9 Claims, 7 Drawing Sheets (51) Int. Cl.
    *H01L 23/52*     (2006.01)
    *H01L 29/40*     (2006.01)
    *H05K 3/40*     (2006.01)
    *H05K 13/00*     (2006.01)
    *H05K 3/28*     (2006.01)
    *H05K 3/34*     (2006.01)

(52) U.S. Cl.
    CPC ... *H05K 3/3473* (2013.01); *H05K 2201/0367* (2013.01); *H05K 2203/054* (2013.01); *H05K 2203/0577* (2013.01)

(58) Field of Classification Search
    USPC .......................................................... 174/257
    See application file for complete search history.

(56) References Cited

U.S. PATENT DOCUMENTS

| | | | |
|---|---|---|---|
| 2006/0043158 A1* | 3/2006 | Wang | B23K 35/02 228/245 |
| 2006/0079079 A1 | 4/2006 | Muthukumar et al. | |
| 2006/0202331 A1* | 9/2006 | Hu | H01L 21/4853 438/613 |
| 2007/0298546 A1 | 12/2007 | Lee et al. | |
| 2009/0107709 A1 | 4/2009 | Mok et al. | |
| 2010/0155116 A1* | 6/2010 | Kawai et al. | 174/257 |
| 2010/0326709 A1* | 12/2010 | Kawano et al. | 174/257 |
| 2011/0108313 A1* | 5/2011 | Kung | H05K 3/062 174/261 |
| 2011/0108315 A1* | 5/2011 | Kung | H05K 3/4007 174/261 |
| 2011/0189848 A1 | 8/2011 | Ewert et al. | |
| 2011/0214915 A1 | 9/2011 | Kawamura et al. | |

FOREIGN PATENT DOCUMENTS

| | | |
|---|---|---|
| JP | 2001-077140 A | 3/2001 |
| JP | 2004-079839 A | 3/2004 |
| JP | 2006-173654 A | 6/2006 |
| JP | 2008-004924 A | 1/2008 |
| KR | 10-2007-0116967 A | 12/2007 |
| KR | 10-2009-0130475 A | 12/2009 |
| KR | 10-2010-0120501 A | 11/2010 |
| TW | 200803660 A | 1/2008 |
| TW | 201026910 A | 7/2010 |
| WO | WO-2010/046235 A1 | 4/2010 |

OTHER PUBLICATIONS

International Search Report in International Application No. PCT/KR2011/010057, filed Dec. 23, 2011.
Notice of Allowance dated Jul. 31, 2012 in Korean Application No. 10-2010-0134546, filed Dec. 24, 2010.
Notice of Allowance dated Nov. 8, 2012 in Korean Application No. 10-2010-0134547, filed Dec. 24, 2010.
Office Action dated Jan. 17, 2012 in Korean Application No. 10-2010-0134546, filed Dec. 24, 2010.
Office Action dated Dec. 27, 2011 in Korean Application No. 10-2010-0134547, filed Dec. 24, 2010.
Office Action dated Aug. 30, 2013 in Taiwanese Application No. 100148569, filed Dec. 26, 2011.
Office Action dated Sep. 29, 2015 in Chinese Application No. 201180068501.8.

* cited by examiner

| Prior art | Present invention |
|---|---|
|  |  |

FIGURE 22

PRINTED CIRCUIT BOARD AND METHOD FOR MANUFACTURING SAME

BACKGROUND OF THE INVENTION

Technical Field

The present invention relates to a printed circuit board and a method for manufacturing the same.

Description of the Related Art

The printed circuit board (PCB) refers to print the circuit pattern on an electrical insulating substrate using a conductive materials such as copper, particularly means a board just before mounting an electronic components.

That is, in order to densely mount various types of the electronic elements on a flat panel, the printed circuit board means a circuit board for confirming a mounting location of each part, printing and fixing the circuit pattern connected to the part on the flat panel.

A demand for a high performance, a compact, a cost-competitive and a period for payment in an electronics industry increases according to a development of the electronics industry. In response to these trends, a printed circuit board companies achieves a thin and densification of the printed circuit board using semi additive process (SAP).

FIGS. 1a to 1e are cross-sectional views showing a bump manufacturing process in a typical printed circuit board.

Figure 1A:
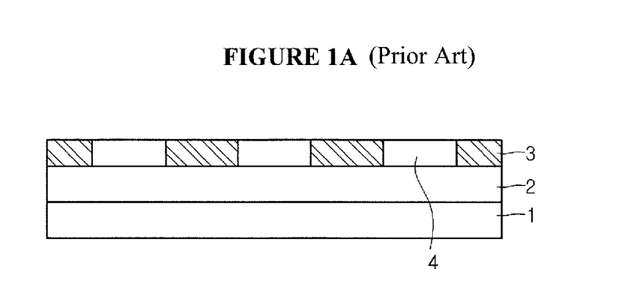
FIGS. 1A to 1E are cross-sectional views showing a method for manufacturing the printed circuit board of the prior art.

First, a first metal layer 2 is formed on an insulating board (electric insulation plate) as shown in FIG. 1a. In addition, the first metal layer 2 may be made of copper, nickel or an ally thereof. If the first metal layer 2 is formed, a first mask pattern 3 is formed on the first metal layer 2. And then, the pad 4 is formed by electroplating the first metal layer 2 using first metal layer 2 as seed layer, centering on the first mask pattern. Then, a pad 4 is formed by electroplating a first metal layer as a seed layer centering on the formed first mask pattern 3. When the pad 4 is formed, an unnecessary part 2, for example the first metal layer 2 and the first mask pattern 3 is removed through a peeling and etching process.

Figure 1B:
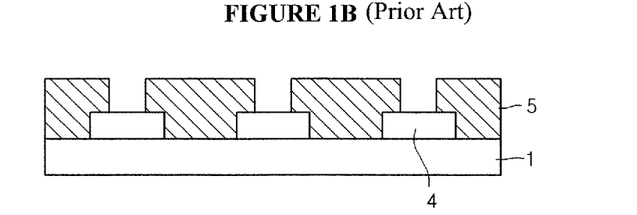

Then, a solder resist 5 exposing the formed pad 4 is formed on the insulating substrate 1 formed with the pad 4.

Figure 1C:
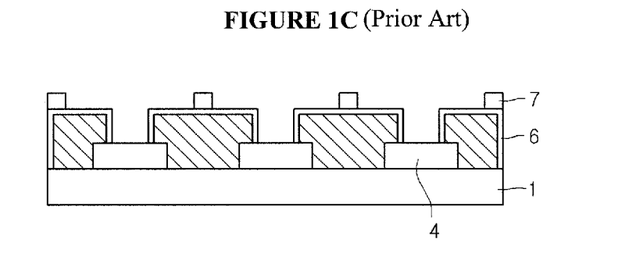

Then, the second metal layer 6 is formed on the doped solder resist 5 as shown in FIG. 1c and a second mask pattern 7 is formed on the formed second metal layer 6.

In this case, a surface treatment of the solder resist 5 is performed to ensure adhesion between the sold resist 5 and the second metal layer 6.

Figure 1D:
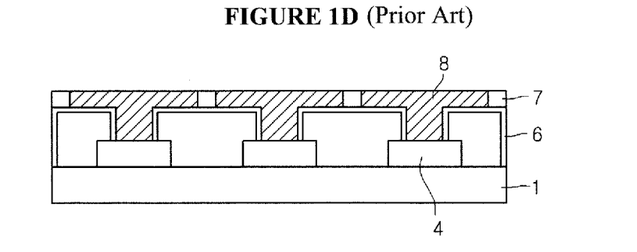
Figure 1E:
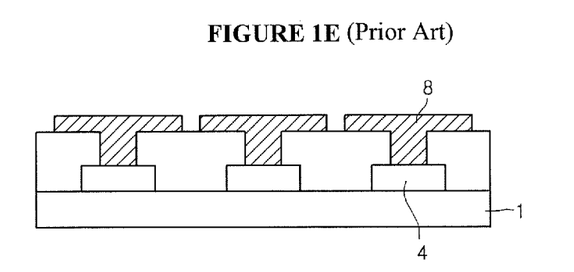

After this, as shown in FIG. 1D, a bump 8 is formed on the pad 4 and then the unnecessary parts, for example the second metal layer 6 and the second mask pattern 7 are removed through the peeling and etching process as shown in FIG. 1e.

The present invention relates to a printed circuit board and a method for manufacturing the same.

However, according to the prior art as described above, the addition process such as a surface treatment and the formation of the second metal layer is required at the time of a formation of the bump, therefore, the resulting additional cost will occur.

An embodiment of the present invention provides a printed circuit board and a method for manufacturing the same.

In addition, another embodiment of the present invention provides the printed circuit board and a method of implementing a fine pitch in the printed circuit board of a solder mask defined (SMD) design and a non solder mask defined (NSMD) design.

A technical problem for being resolved by the present invention is not limited to the above-mentioned problem and those skilled in the art will be clearly understand that there are other problems that are not mentioned above through the following description.

SUMMARY OF THE INVENTION

According to an embodiment of the present invention, a printed circuit board includes: an insulating layer; at least one circuit pattern or pad formed on the insulating layer; a solder resist having an opening section exposing the upper surface of the pad and formed on the insulating layer; and a bump formed on the pad exposed through the opening section of the solder resist and having a lower area narrower than the upper area.

The bump may embed the opening section of the solder resist and may be formed to be protruded over the surface of the solder resist.

The bump may have an upper surface and a lower surface facing the upper surface, wherein the area thereof is the same.

The bump may have the same area as an area of the opening section of the solder resist.

The bump may be made of an alloy containing copper or an alloy containing tin.

The bump may include a first bump made of the alloy containing copper and a second bump made of the alloy containing tin.

The seed layer of the bump may further include between the solder resist and the bump.

The plating seed layer may be protruded over the solder resist to be formed at the side surface of the bump.

According to another embodiment of the present invention, a method for manufacturing a printed circuit board includes: forming a pad on an insulating board; applying a solder resist having an opening section exposing an upper surface of the pad to the insulating board; forming a mask having a window opening the opening section on the opening section; and forming a bump embedding the opening section of the solder resist and the window of the mask.

The forming of the mask may include stacking a dry film opening the opening section on the solder resist.

The forming the mask may include forming the mask having the window of the same area as the opening section of the solder resist.

The forming of the bump may include: a plating layer wrapping the upper surface and the side surface of the mask; producing the plating layer as the seed layer to plate the alloy containing copper and the alloy containing tin; and forming the bump embedding the opening section of the solder resist and the window of the mask.

The forming of the bump may include: forming the conductive layer wrapping an upper surface and the side surface of the mask; producing the plating layer as the seed layer to plate the alloy containing copper; and forming a first bump embedding a portion of the opening section of the solder resist and the window of the mask and plating the alloy containing tin to form a second bump embedding the opening section of the solder resist and the window of the mask.

The forming of the mask may include: stacking the mask embodding the pad on the solder resist; and forming the window exposing the pad by performing a laser machining on the stacked mask.

The opening section of the solder resist and a window of the pad may be simultaneously formed by laser machining.

The mask may include a dry film.

The forming of the bump may include forming the bump having the same area of an upper surface and an lower surface facing the upper surface.

The forming of the bump may include a bump having the same area as any one of at least one area of the window of the mask.

Moreover, the forming of the bump may include the bump embedding the solder resist opening and protruded over the surface of the solder resist.

DESCRIPTION OF THE PREFERRED EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

In addition, when an element is referred to as being "on" another element, it can be directly on the another element or be indirectly on the another element with one or more intervening elements interposed therebetween.

Also, when an element is referred to as being "connected to" another element, it can be directly connected to the another element or be indirectly connected to the another element with one or more intervening elements interposed therebetween. Hereinafter, like reference numerals refer to like elements.

A printed circuit board according to a first embodiment of the prevent invention will be described with reference to FIGS. 2 to 10.

Figure 2:
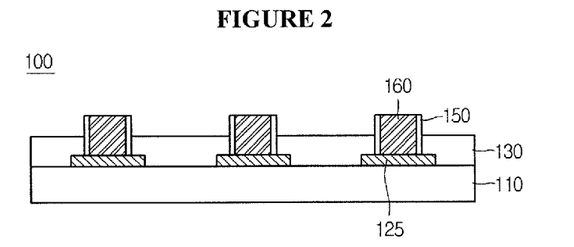
FIG. 2 is a cross-sectional view of a printed circuit board according to a first embodiment of the present invention.

FIG. 2 is a cross-sectional view according to a first embodiment of the present invention.

Referring to FIG. 2, a printed circuit board 100 according to a first embodiment of the present invention includes an insulating plate 110, a pad 125 connected to a circuit pattern (not shown) formed on the insulating plate 110, and a solder resist 130 covering the plating seed layer 150 and the circuit pattern of the bump 160.

The insulating plate 100 may be a thermosetting or thermoplastic polymer boadr, a ceramic board, organic-inorganic composite material board or glass fibers impregnated board and if the insulating plate 100 includes a polymer resin, this may contains epoxy insulating resin, in contrast with this may contain polyimide resin.

A plurality of pads connected with a plurality of circuit patterns are on the insulating plate 110. The pad 125 is formed such that the element is mounted on the printed circuit board and means the pad 13 attached with the solder (not shown).

The pad 125 is made of a conductive material and if the circuit pattern is formed by pattering a copper thin layer formed on the insulating plate 110, the pad is made of the alloy containing copper.

In this case, the pad 125 may be formed by an electric copper plating producing the metal layer formed at the side of the solder resist 150 as seed layer. The plating layer 150 may be formed on the side of the solder resist 130 and on upper surface and the side surface of the mask by chemical copper plating.

The plurality of bump 160 covering the upper surface of the pad 125 is formed on the pad 125. In this case, the bump 160 is formed to have a narrower area than that of the pad 125 by the electric copper plating.

In addition, since the bump 160 is formed by the plating, the area of the upper surface of the bump 160 and the lower surface facing the upper surface is the same. The bump 160 is formed in shape of cylinder pillars and a square pillars, which the area of the upper and lower is the same.

In this case, the solder resist 130 has the opening section 135 exposing the solder resist 125 and the bump 160 is formed by embedding the opening section 135. Therefore, the bump 160 has the same area as the area of the opening section 135.

Practically, a portion of the bump 160 is composed of the plating layer 150. Therefore, the bump 160 includes the plating layer 150.

The bump 160 may be made of the alloy containing the same material, for example copper as the pad 125. In addition, the bump 160 may be the solder bump made of an alloy containing tin.

On the other hand, the bump 160 plating the alloy containing copper on the pad 125 may be formed and the bump 180 plating alloy containing tin may be also formed.

The solder resist 130 covering the circuit pattern is formed on the insulating plate 110.

The solder resist 130 is to protect the surface of the insulating plate 110 wherein the solder resist is formed in the front surface of the insulating plate 110 and the opening section opening the upper surface of the pad to be exposed.

The bump 160 is formed by embedding the opening section 135 having the opening section 135 in the solder resist and is formed to be protruded from the solder resist 130.

In this case, the plating 150 is formed at the side surface of the solder resist 130 and formed to be protruded from the upper surface of the solder resist 130 and to extend to the side of the bump 130.

This is not because the plating layer 150 is formed at the upper surface and the side surface of the solder resist, but is formed at only side surface of the solder resist.

That is, according to the prior art, after providing a surface roughness to the surface of the solder resist by performing a desmear process, the adhesive between the surface of the solder resist and the chemical copper become high by a electroless chemical copper plating. However, this provides the problems that should additionally perform the desmear process, the surface of the solder resist become rough due to the desmear process and degrades a quality of the printed circuit board.

However, in an embodiment of the present invention, the desmear process performing on the surface of the solder resist is omitted and the chemical copper is formed at the side surface of the solder resist and the upper surface and the side surface of the mask, thereby providing the printed circuit board that a quality problem generating from the solder resist is removed can be provided. That is, according to the embodiment of the present invention, the process generated at the formation of the bump is minimized, so that a manufacturing cost is reduced and the surface of the solder resist can be effectively protected.

Referring to FIG. 3 to FIG. 10, a method for manufacturing the printed circuit board in FIG. 2 will be described.

FIGS. 3 to 10 are cross-sectional views showing the printed circuit board according to the first embodiment of the present invention.

Figure 3:
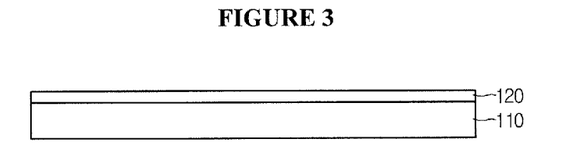
FIGS. 3 to 10 are cross-sectional views showing a method for manufacturing a printed circuit board according to a first embodiment of the present invention in process order.

First, the insulating plate 10 is prepared.

A plurality of circuit patterns are formed at the insulating plate 110 of FIG. 3 and the circuit pattern is also at lower portion of the insolating plate 110.

That is, when the insulating plate 10 means one insulating layer of the plurality of stack layer structures, the plurality of circuit pattern (not shown) may be formed the upper portion and the lower portion of the insulating plate 110 in succession, otherwise, the plurality of circuit patterns are formed at both upper portion and lower portion in succession.

The insulating plate 110 may be a thermosetting or thermoplastic polymer board, a ceramic board, organic-composite board or glass fiber impregnated board, if the insulating plate is a polymer resin, it can contain epoxy resin based insulating resin, and otherwise contains polyimide based resin.

After this, the conductive layer 120 is stacked over the insulating plate 110.

Thereafter, the conductive layer 120 is stacked on the insulating plate 110.

The conductive layer 120 may be formed by performing electroless plating containing copper on the insulating plate 10.

In addition, unlike the conductive layer 120 performs electroless plating on the insulating plate 110, a copper clad laminate (CCL) may be used.

When the conductive layer 120 is formed by the non-electrolyte, the plate can be smoothly performed by providing the surface roughness to the top surface of the insulating plate 110.

Figure 4:
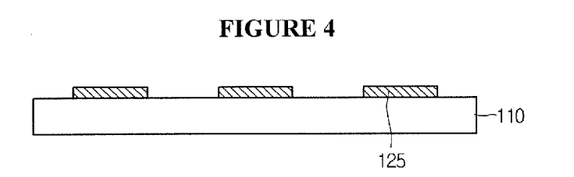

In the stack layer structure of the insulating plate 110 and the conductive layer 120, the pad 125 of FIG. 4 and the circuit pattern (not shown) is formed by etching the conductive layer 120.

In this case, the conductive layer 120 formed on the insulating plate 110 may be formed at the upper surface and the lower surface of the insulating plate 110 and therefore the circuit pattern (not shown) and the pad 125 may be also formed at the lower surface of the insulating plate 110.

Figure 5:
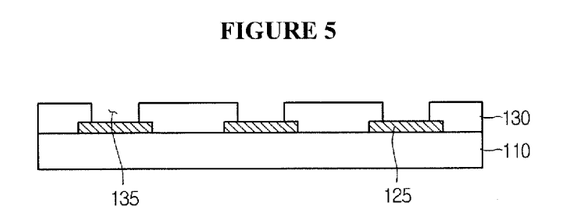

Therefore, the circuit pattern and the pad 125 may be formed in at least one surface of the insulating plate 110 and the solder resist 130 in which embeds the circuit pattern formed at the insulating plate 10 is applied as shown in FIG. 5.

At this time, the solder resist 130 includes the opening section 135 exposing the pad 135 and the opening section 135 is formed to have a smaller width than that of the pad 125, so that an edge area of the pad 125 is protected by the solder resist 130.

Figure 6:
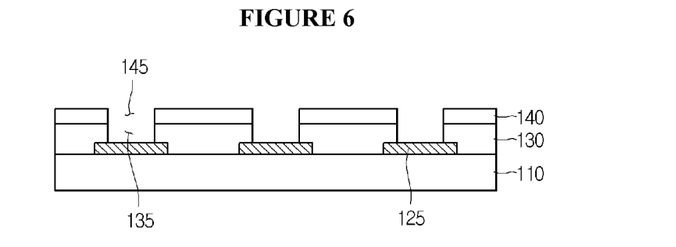

Thereafter, the mask 140 is stacked on the solder resist 130 as shown FIG. 6.

The mask 140 uses a photo resist or a dry film. At this time, the mask 140 preferably uses a high heat-resistant dry film.

The mask 140 has the window 145 corresponding to the opening section 135 in the solder resist 130.

That is, the window 145 exposing the pad 125 is formed on the mask 140.

In this case, the window 145 may be formed to have the same area as the opening section 135 in the solder resist 130.

Figure 7:
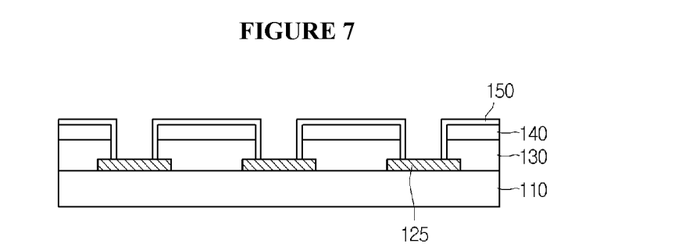

Next, as shown in FIG. 7, the plating layer 150 is formed at upper side and a side surface and the side surface of the solder resist 130.

The plating layer 150 may be formed at upper surface and the side surface of the mask 130 and the solder resist 130 by chemical copper plating.

The chemical copper plating scheme can a soft-corrosion process, pre-catalytic process, a catalytic process, an activation process, an electroless plating process and an oxidation preventing process in the order.

In addition, the copper plating is classified into an heavy copper (more than 2 μm), a medium copper (1~2 μm) and a light copper (less than 1 μm) depending on a thickness wherein the plating layer 150 meeting 0.5~1.5 μm forms as the medium copper, light copper.

Figure 8:
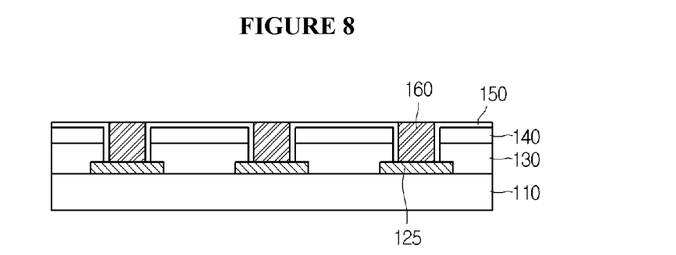

Next, as shown FIG. 8, the bump 160 is formed by embedding the opening section 135 of the solder resist 130 and the window 145 of the mask 140.

The bump 160 may be formed by embedding the entire opening section 135 and the window 145 using the electric copper processing and may be also formed by embedding only a portion of the opening section 135 and the window 145.

The bump 160 may be made of the alloy containing the same material, for example copper as the pad 125.

In addition, the bump 160 may be made of the solder bump formed with alloy containing tin. That is, the bump 160 may be made of only tin, an alloy of tin and palladium mixed at a predetermined ratio and an additional alloy containing silver in addition to tin and palladium.

When the bump 160 is made of the alloy containing copper, the solder may additionally be formed over the bump 160 later.

In addition, when the bump 160 is made of the alloy containing tin, the bump 160 itself serves to the solder.

Figure 9:
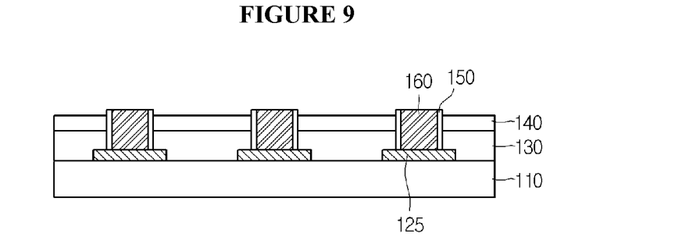

Next, the plating layer 150 formed at the upper side of the mask is selectively removed by the etching process in shown in FIG. 9.

Figure 10:
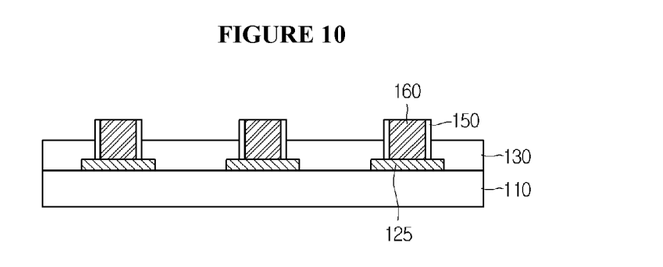

Thereafter, the mask 140 is stacked on the solder resist 130 as shown in FIG. 10.

That is, when the bump 160 is formed, the plating layer 150 used as the seed layer at the time of formation of the bump is selectively removed. At this time, the plating layer 150 may be removed from the upper side of the mask 140 by a flash etching process.

Moreover, if the plating layer 160 is removed, the mask formed on the solder resist is detached. At this time, the mask 140 is detached; a solvent residue on the surface of the solder resist may be removed through a clearing process.

As described above, according to a method for manufacturing the printed circuit board according to a first embodiment of the present invention, the desmear process performing on the surface of the solder resist 130 is omitted and the quality problem occurring at the surface of the solder resist is resolved.

A printed circuit board according to a second embodiment of the present invention will be described with reference to FIGS. 11 to 15. The same parts as the printed circuit board according to a first embodiment will omitted for convenience of a description.

Figure 11:
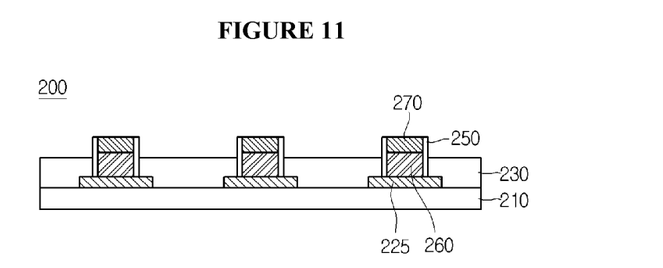
FIG. 11 is a cross-sectional view of a printed circuit board according to a second embodiment of the present invention.

FIG. 11 is a cross-sectional view according to a second embodiment of the present invention.

Referring to FIG. 11, the printed circuit board 200 according to a embodiment of the present invention includes an insulating plate 210, a pad 225 connected to the circuit pattern (not shown) formed on the insulating plate 210, a first bump 260 forming on the pad 225, a second bump 270 formed on a first bump 260 and a solder resist 230 covering a plating seed layer 250 of the first bump 260 and the second bump 270 and the circuit pattern.

In practice, the differences between the printed circuit board 200 according the second embodiment and the printed circuit board according to the first embodiment is only the part of the bump and the other part is identical.

Therefore, a different bump portion from the printed circuit board 100 will only described.

The printed circuit board 200 according to a second embodiment includes a first bump 260 and a second bump 270.

The first bump 260 is formed on the pad 225 and forms the alloy containing copper.

In addition, the second bump 270 is formed on a first bump 260 and forms the alloy containing tin.

That is, the first bump 260 is formed by plating the alloy containing copper to embed only a portion of the window 245 of the mask 240 and the solder resist 230 of the solder resist 230.

In addition, the second bump 270 is formed by plating the alloy containing tin to embed the opening section 235 of the solder resist 230 and the window 245 of the mask 240 on the formed first bump.

Referring to FIG. 12 to FIG. 15, a method for manufacturing the printed circuit board of FIG. 11 will be described.

FIGS. 12 to 15 are cross-sectional views showing the printed circuit board according to the second embodiment of the present invention.

Figure 12:
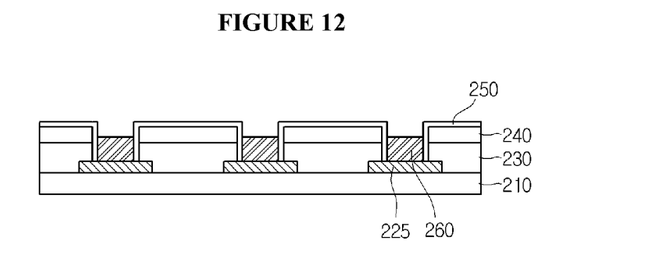
FIGS. 12 to 15 are cross-sectional views showing a method for manufacturing a printed circuit board according to an second embodiment of the present invention in process order.

First, the insulating plate 210 as shown in FIG. 12 is prepared. A plurality of circuit patterns is formed at the insulating plate 210 of FIG. 12 and the circuit pattern is also at lower portion of the insolating plate 210.

The insulating plate 110 may be a thermosetting or thermoplastic polymer board, a ceramic board, organic-composite board or glass fiber impregnated board, if the insulating plate contains a polymer resin, otherwise, it can contain epoxy resin based insulating resin, otherwise may contains polyimide.

Thereafter, the conductive plate 220 is stacked on the insulating plate 210 and the pad 225 is formed by selectively etching the stacked conductive layer 220.

Therefore, the circuit pattern and the pad 225 may be formed in at least one surface of the insulating plate 210 and the solder resist 230 for embedding the circuit pattern formed at the insulating plate 10 is applied.

In this case, the solder resist 230 includes the opening section exposing the pad 235 and the opening section 235 is formed to have a smaller width than that of the pad 225, so that an edge area of the pad 225 is protected by the solder resist 230.

After this, the mask 240 is stacked on the insulating plate 230.

The mask 240 has the window 245 corresponding to the opening section 235 in the solder resist 230. That is, the window 245 exposing the pad 225 is formed on the mask 240.

Next, the plating layer 250 is formed at upper surface and a side surface of the mask 240 and the solder resist 230. The plating layer 250 may be formed at upper surface and the side surface of the mask 240 and the solder resist 230 by chemical copper plating scheme.

Next, the bump 260 is formed by embedding the opening section 235 of the solder resist 230 and the window 245 of the mask 240.

The first bump 260 is formed by embedding only a portion of the opening section 235 and the window 245 using the electric copper plating processing.

The first bump 26 may be made of the alloy containing the same material, for example copper as the pad 225.

Figure 13:
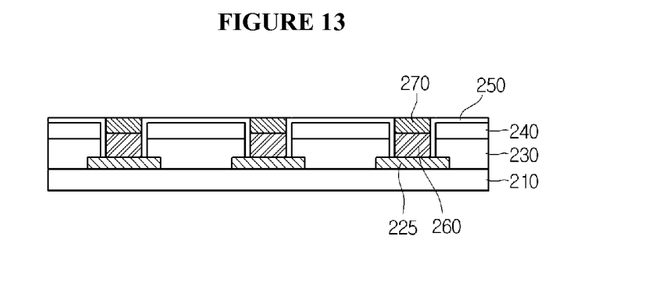

Next, as shown in FIG. 13, the second bump 270 is formed on the first bump 260. The second bump 270 is formed by embedding the entire opening section 235 and the window 245.

That is, the second bump 270 may be made of only tin, an alloy of tin and palladium mixed at a predetermined ratio and an additional alloy containing silver in addition to tin and palladium.

Figure 14:
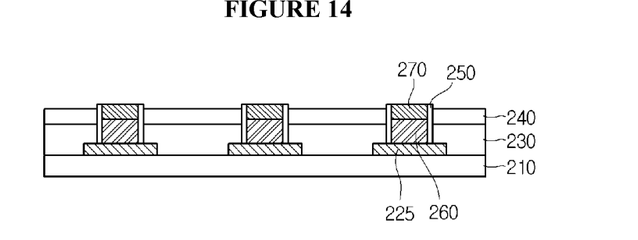

Next, the plating layer 250 formed at the upper side of the mask 240 is selectively removed by the etching process in shown in FIG. 14.

Figure 15:
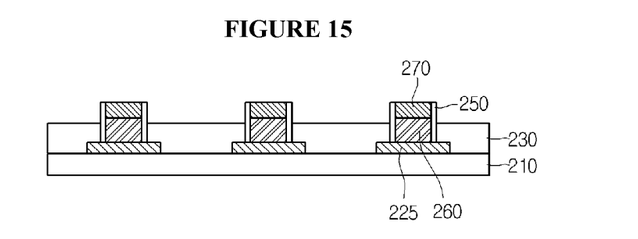

Thereafter, the mask 240 stacked on the solder resist 230 as shown FIG. 15 is removed.

That is, when the first bump 260 and the second bump 270 is formed, the plating layer 260 using as seed layer at the time of formation of the first bump 260 and the second bump 270 is selectively removed. At this time, the plating layer 250 may be removed from the upper side of the mask 240 by a flash etching process.

Moreover, the plating layer 250 is removed, the mask 240 formed over the solder resist 230 is detached. At this time, when the mask 240 is detached, a solvent residual on the surface of the solder resist 130 may be removed through a clearing process.

FIGS. 16 to 20 are a cross-sectional view showing the printed circuit board according to third embodiment of the present invention.

Figure 16:
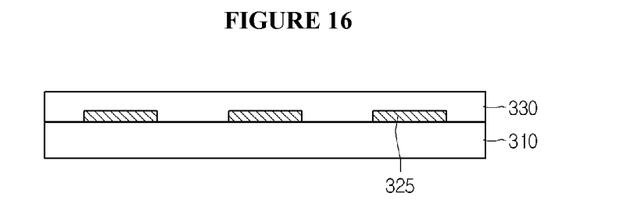
FIGS. 16 to 20 are cross-sectional views showing a method for manufacturing a printed circuit board according to an third embodiment of the present invention in process order.

Referring to FIG. 16, the insulating plate 310 is prepared.

A plurality of circuit patterns are formed with the insulating plate 310 and the circuit pattern is formed also at lower portion of the insolating plate 310.

That is, when the insulating plate 310 means one insulating layer of the plurality of stack layer structure, the plurality of circuit pattern (not shown) may be formed at the upper portion and the lower portion of the insulting plate 310) in succession, otherwise the plurality of circuit patterns is successively formed at both upper portion and lower portion of the insulating plate 310.

After this, the conductive layer 320 is stacked on the insulating plate 310.

In addition, the conductive layer 320 performs then non-electrolyte plating on the insulating plate 310 and a copper clad laminate (CCL) may be used.

In the stack layer structure of the insulating plate 310 and the conductive layer 320, the pad 325 and the circuit pattern (not shown) are formed by etching the conductive layer 320.

In this case, the conductive layer 320 formed on the insulating plate 310 may be formed at the upper surface and the lower surface of the insulating plate 310 and therefore the circuit pattern (not shown) and the pad 325 may be also formed at the lower surface of the insulating plate 310.

Therefore, the circuit pattern and the pad 325 may be formed in at least one surface of the insulating plate 110 and the solder resist 330 to embed the circuit pattern and the pad 325 formed at the insulating plate 110 is applied.

In this case, the solder resist 320 also embeds the pad 325.

Figure 17:
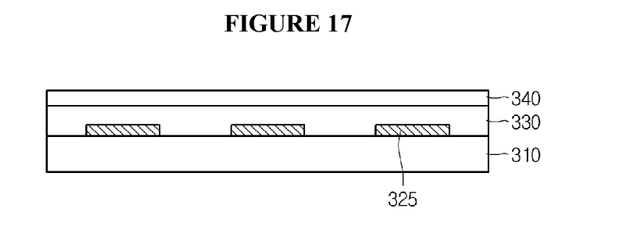

Thereafter, the mask 340 is stacked on the solder resist 330 as shown FIG. 17.

The mask 340 uses a photo resist or a dry film. In this case, the mask 340 preferably uses a high heat-resistant dry film.

Figure 18:
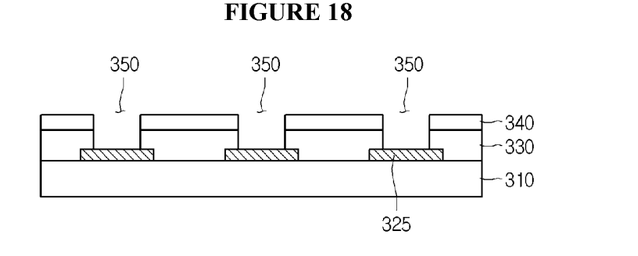

Next, the opening section 350 exposing the pad 325 to the solder resist 330 the mask 340 by performing the laser machining as shown in FIG. 18.

The laser machining provides a high flexibility of a work, process a complex shape or a small quantity without an high molding cost, is adapted to be a recent market conditions in a small production and a prototype process is much used.

The laser machining is a cutting method by which that focuses an optical energy on the surface to melt and evaporate a portion of the material thereby taking a predetermined shape, wherein the laser machining easily machines a complex shape by a computer program and can operate a tough composite material that cutting is difficult. A cutting diameter is possible to min 0.005 mm and a machining thickness range is also wide.

A laser drill uses preferably an yttrium aluminum garnet (YAG) laser or CO2 laser. YAG laser is a laser capable of machining both the copper clad laminate and an insulating laser and CO2 laser is a laser that can process only the insulating layer.

That is, the opening section of the solder resist 330 and the window of the mask 340 are formed at a time by laser machining at the stacked state of the solder resist 330 and the mask 340.

Figure 19:
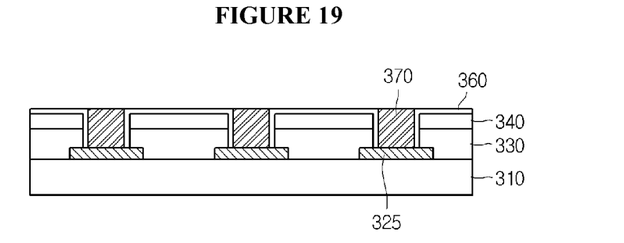

Next, as shown in FIG. 19, the plating layer 360 is formed at upper side and a side surface and the side surface of the solder resist 330. The plating layer 360 may be formed at upper surface and the side surface of the mask 340 and the solder resist 330 by chemical copper plating.

Next, the bump 370 is formed by embedding the opening section of the solder resist 330 and the opening section 350 including the window of the mask 340.

The bump 370 may be formed by embedding the entire opening section 350 using the electric copper processing and may be also formed by embedding only a portion of the opening section 350.

The bump 370 may be formed by the alloy containing the same material copper as the pad 325, for example copper. In addition, the bump 370 may be formed by the alloy containing tin. That is, the second bump 370 may be made of only tin, an alloy of tin and palladium mixed at a predetermined ratio and an additional alloy containing silver in addition to tin and palladium.

In addition, the bump 370 includes a first bump formed with an alloy containing copper and a second bump formed with alloy containing tin.

Figure 20:
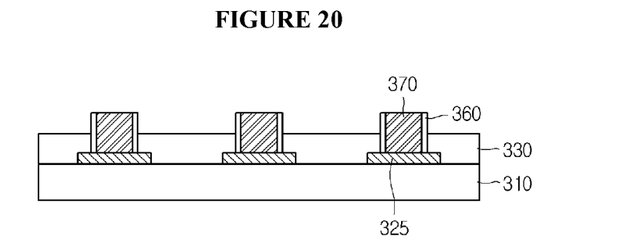

Next, as shown in FIG. 20, the conductive layer 360 formed on the upper side of the mask 340 by performing the etching process is removed. In addition, the mask 340 stacked on the solder resist 330 is removed.

At this time, the mask 140 is detached; a solvent residual on the surface of the solder resist 130 may be removed through a cleaning process.

Meanwhile, a chemical treatment time or an increased concentration is provided on of the surface the solder resist to certainly remove the mask 140, 240, 340. If the concentration increases, the surface of solder resists 130, 230, 330 is damaged by the chemical treatment. Therefore, in the embodiment of the present invention, a separate protective layer (not shown) is formed on the solder resist 130, 230, 330 before forming the mask 140, 240, 340. Therefore, in the embodiment of the present invention, the mask 140, 240, 330 is not direct contact with the solder resist 130, 230, 330. The protective layer consists of copper, nickel, chromium, titanium or an ally of at least one of them. The protective layer may be formed through an electroless chemical plating or a sputtering process. In addition, the protective layer has the thickness of 0.1~10 μm and is formed between the solder 130, 230 330 and the mask 140, 240, 340. Thereafter, the bump formation process completes, the mask 140, 240, 340 is removed and if the mask 140, 240, 340 is removed, the protective layer is removed. The protective layer can be removed by etching solution corresponding metal forming the protective layer, At this time, since the bump is formed as metal different from the protective layer, the bump is not damaged and effectively remove the only the protective layer.

Figure 21:
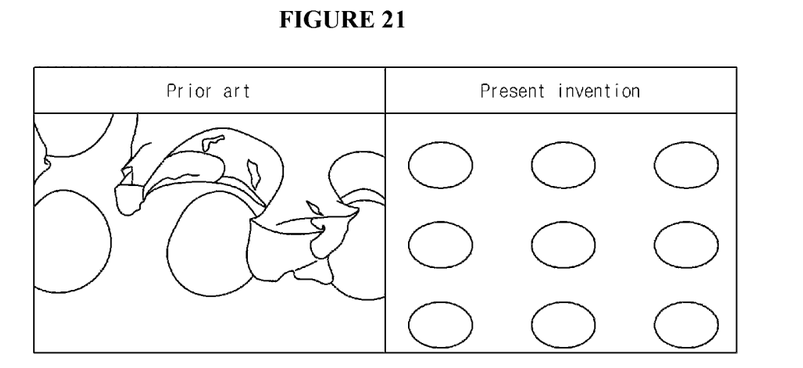
FIG. 21 shows a bump and solder resist for a related art printed circuit board (left side of figure) and a bump and solder resist according to an embodiment of the present invention (right side of figure).

FIG. 21 shows the bump and solders resist formed by the embodiment of the present invention. Referring to FIG. 21, in the printed circuit board manufactured by the prior art, there is a residue of the mask stacked for the formation of the bump around the solder resist. However, in the present invention, there no a separate residue on the solder resist by performing a bump manufacturing process after stacking the protective layer on the solder resist.

Figure 22:
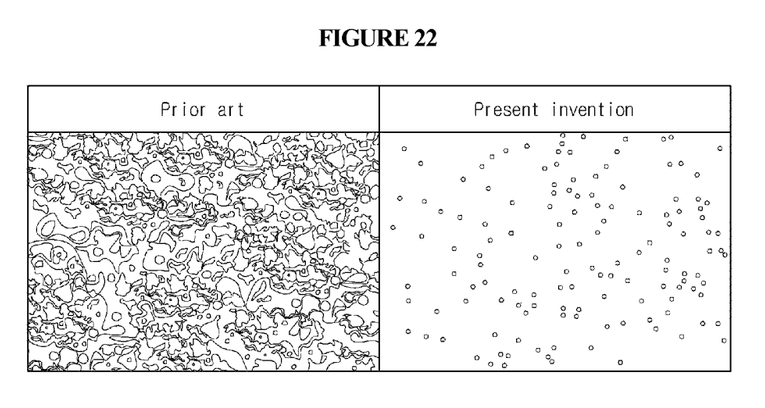
FIG. 22 shows a related art solder resist (left side of figure) and a solder resist according to an embodiment of the present invention (right side of figure).

FIG. 22 shows the solder resist formed by the embodiment of the present invention. Referring to FIG. 22, in the prior art, a damage of the solder resist occurs in process of removing the mask, thereby providing a lower reliability of the printed circuit board.

However, according to the embodiment of the present invention, since the bump formed after stacking the protective layer over the solder resist, the stable and reliable printed circuit board is provided without a damage of the solder resist.

The embodiments of the present invention can provide the printed circuit board having the improved reliability and stability with the minimum process, without performing the surface treatment process of the solder resist required for forming the bump.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A printed circuit board, comprising:
   an insulating layer;
   at least one circuit pattern or pad formed on the insulating layer;
   a solder resist having an opening section exposing an upper surface of the at least one circuit pattern or pad and formed on the insulating layer;
   a seed layer formed at a side surface of the solder resist exposing the upper surface of the at least one circuit pattern or pad, and protruded over a surface of the solder resist; and
   a bump formed on the pad exposed through the opening section of the solder resist and seed layer, and protruded over the surface of the solder resist;
   wherein the seed layer is disposed between the side surface of the solder resist and a side surface of the bump,
   wherein the seed layer has an upper surface and a lower surface opposite to the upper surface,
   wherein an area of the upper surface of the seed layer is the same as that of the lower surface of the seed layer,
   wherein a height of the seed layer is the same as a height of the bump,
   wherein the upper surface of the protruded seed layer lies in a same plane as an upper surface of the protruded bump,
   wherein the bump comprises:
      a first bump on the at least one circuit pattern or pad exposed through the opening section of the solder resist and formed with an alloy containing copper; and
      a second bump on the first bump, formed with an alloy containing tin and protruded over an upper surface of the solder resist, wherein the upper surface of the protruded seed layer lies in a same plane as an upper surface of the second bump,
   wherein an upper surface of the first bump is higher than the upper surface of the solder resist,
   wherein the seed layer is contacted with side surfaces of the first bump and the second bump,
   wherein an area of an upper surface of the first bump is the same as that of a lower surface of the first bump,
   wherein an area of an upper surface of the second bump is the same as that of a lower surface of the second bump, and
   wherein the area of the upper surface of the first bump is the same as that of the upper surface of the second bump.

2. A method for manufacturing a printed circuit board, comprising:
   forming a pad on an insulating board;
   applying a solder resist having an opening section exposing an upper surface of the pad to the insulating board;
   forming a mask, having a window opening the opening section, on the opening section;
   forming a plating layer surrounding an upper surface and a side surface of the mask, and exposing the upper surface of the pad;
   forming a bump embedding the opening section of the solder resist and the window of the mask on the upper surface of the exposed pad; and
   removing the mask and a portion of the plating layer;
   wherein, after the portion of the plating layer is removed, the plating layer has an upper surface and a lower surface opposite to the upper surface;
   wherein an area of the upper surface of the plating layer is the same as that of the lower surface of the plating layer;
   wherein upper surfaces of the plating layer and the bump are protruded over a surface of the solder resist;
   wherein a height of the plating layer is the same as a height of the bump;
   wherein the upper surface of the protruded plating layer lies in a same plane as the upper surface of the protruded bump,
   wherein the forming of the bump comprises:
      plating an alloy including copper using the plating layer as a seed layer and forming a first bump embedding a portion of the opening section of the solder resist and a portion of the window of the mask; and
      plating an alloy containing tin on the first bump and forming a second bump embedding the opening section of the solder resist and the window of the mask,
   wherein an upper surface of the seed layer lies in a same plane as an upper surface of the second bump,
   wherein an upper surface of the first bump is higher than an upper surface of the solder resist,
   wherein the seed layer is contacted with side surfaces of the first bump and the second bump,
   wherein an area of an upper surface of the first bump is the same as that of a lower surface of the first bump,
   wherein an area of an upper surface of the second bump is the same as that of a lower surface of the second bump, and
   wherein the area of the upper surface of the first bump is the same as that of the upper surface of the second bump.

3. The method of claim 2, wherein the forming of the mask includes stacking a dry film opening the opening section on the solder resist.

4. The method of claim 2, wherein the forming of the mask includes forming the mask having the window of the same area as the opening section of the solder resist.

5. The method of claim 2, wherein the applying of the solder resist includes:
   applying the solder resist embedding the pad to the insulating board; and
   performing a laser machining on the applied solder resist and forming the opening section exposing the upper surface of the pad.

6. The method of claim 2, wherein the forming of the mask includes:
   stacking the mask embedding the pad on the solder resist; and
   forming the window exposing the pad by performing a laser machining on the stacked mask.

7. The method of claim 2, wherein the opening section of the solder resist and the window of the mask are simultaneously formed by a laser machining.

8. The method of claim 2, wherein the mask includes a dry film.

9. The method of claim 2, further comprising,
   forming a separate protective layer on the solder resist before forming the mask,
   wherein the mask is formed on the separate protective layer, and
   wherein the separate protective layer is formed of a metal different from the first and second bumps.

* * * * *